United States Patent
Chuang

(10) Patent No.: US 10,826,443 B2
(45) Date of Patent: Nov. 3, 2020

(54) COMMON MODE OVERLOAD RECOVERY FOR AMPLIFIER

(71) Applicant: TEXAS INSTRUMENTS INCORPORATED, Dallas, TX (US)

(72) Inventor: Shang-Yuan Chuang, Tucson, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/433,855

(22) Filed: Jun. 6, 2019

(65) Prior Publication Data

US 2020/0136570 A1     Apr. 30, 2020

Related U.S. Application Data

(60) Provisional application No. 62/753,204, filed on Oct. 31, 2018.

(51) Int. Cl.
| | |
|---|---|
| H03F 3/45 | (2006.01) |
| H03F 1/52 | (2006.01) |
| H03F 3/213 | (2006.01) |
| H03G 3/30 | (2006.01) |

(52) U.S. Cl.
CPC .............. H03F 1/523 (2013.01); H03F 3/213 (2013.01); H03G 3/3089 (2013.01)

(58) Field of Classification Search
CPC ........................................................ H03F 3/45
USPC ...................................................... 330/253, 69
See application file for complete search history.

(56) References Cited

U.S. PATENT DOCUMENTS 6,806,771 B1 * 10/2004 Hildebrant ............ H03F 1/3211
                                                         330/278
8,207,776 B1 *  6/2012 Gilbert .................... G06G 7/24
                                                         327/350

* cited by examiner

Primary Examiner — Henry Choe
(74) Attorney, Agent, or Firm — John R. Pessetto; Charles A. Brill; Frank D. Cimino

(57) ABSTRACT

A circuit includes a first transistor having a first control input and first and current terminals. The circuit also includes a second transistor having a second control input and third and fourth current terminals. The third current terminal couples to the first current terminal at a first node. An output stage has a first input, a second input, and an output stage output. The first input couples to the fourth current terminal, and the second input couples to the second current terminal. A resistor has first and second resistor terminals. The first resistor terminal couples to the output stage output, and the second resistor terminal couples to the second control input. A third transistor has a third control input, a fifth current terminal, and a sixth current terminal. The fifth current terminal couples to the first resistor terminal, and the sixth current terminal couples to the second resistor terminal.

20 Claims, 5 Drawing Sheets

US 10,826,443 B2

COMMON MODE OVERLOAD RECOVERY FOR AMPLIFIER

CROSS-REFERENCE TO RELATED APPLICATIONS

This application claims priority to U.S. Provisional Application No. 62/753,204, filed Oct. 31, 2018, which is hereby incorporated by reference.

BACKGROUND

In some signal processing applications, an analog signal in a first voltage domain is to be digitized by an analog-to-digital converter (ADC) in a second voltage domain. For example, the analog signal may comprise any voltage up to +/−18 V, but the ADC operates from a 5 V power supply, A programmable gain amplifier (PGA) is included to attenuate the analog signal in cases which the analog signal is outside the 5 V range of the ADC. The amplifier also is capable of amplifying the analog signal in cases in which the analog signal is small.

SUMMARY

In one example, a circuit includes a first transistor having a first control input and first and current terminals. The circuit also includes a second transistor having a second control input and third and fourth current terminals. The third current terminal couples to the first current terminal at a first node. An output stage has a first input, a second input, and an output stage output. The first input couples to the fourth current terminal, and the second input couples to the second current terminal. A resistor has first and second resistor terminals. The first resistor terminal couples to the output stage output, and the second resistor terminal couples to the second control input. A third transistor has a third control input, a fifth current terminal, and a sixth current terminal. The fifth current terminal couples to the first resistor terminal, and the sixth current terminal couples to the second resistor terminal.

BRIEF DESCRIPTION OF THE DRAWINGS

For a detailed description of various examples, reference will now be made to the accompanying drawings in which.

DETAILED DESCRIPTION

Figure 1:
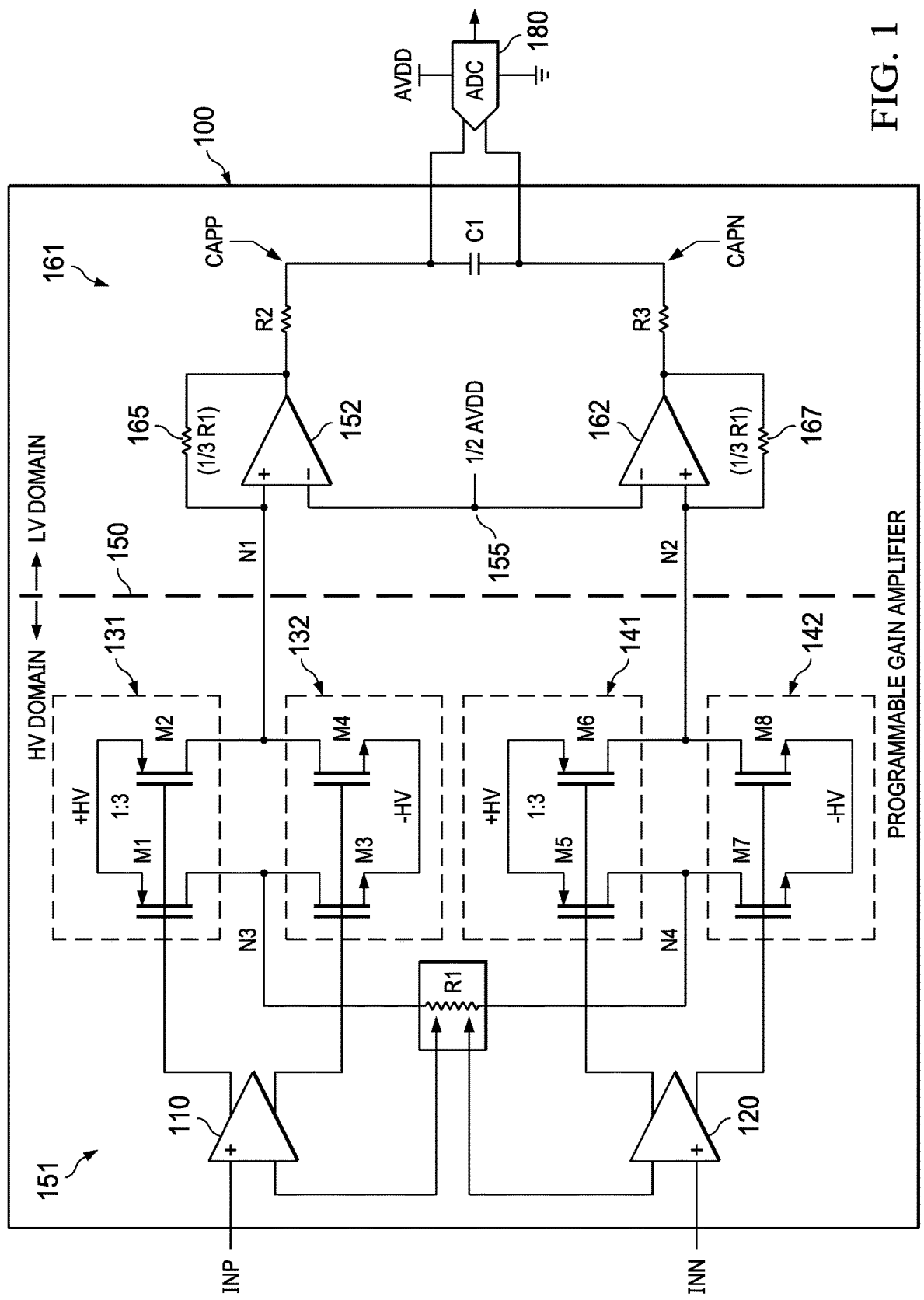
FIG. 1 shows an example of a programmable gain amplifier coupled to an analog-to-digital converter (ADC).

FIG. 1 shows an example of a system comprising a PGA 100 having an input stage 151 and an output stage 161. The PGA 100 is coupled to an ADC 180. In this example, the PGA 100 is configured to receive differential input signal INP and INN. The input signals have a common mode voltage that can be within a range of voltages. The dashed line 150 within the PGA 100 indicates the demarcation between two different voltage domains within the PGA. The left side of dashed line 150 is a higher voltage (HV) domain, and the left side of the dashed line 150 is a lower voltage (LV) domain. The supply rails +HV and −HV represent supply voltages within the HV domain, and AVDD represents the supply voltage for the LV domain. In one example, +HV and −HV is +18V and −18V, respectively, and AVDD is 5V. Different voltages are possible as well in other examples. The input signals INP and INN are between +HV and −HV. In the example in which +HV and −HV is +18V and −18V, INP and INN are between +18V and −18V. The common mode of INP and INN may be 0V or a voltage other than 0V. In one example, the differential voltage between INP and INN is 2V and the common mode voltage is 0V, meaning that INP is +1V and INN is −1V. In another example, the differential voltage between INP and INN is also 2V, but the common mode is 14V, meaning that INP is +15V and INN is +13V.

The ADC 180 in this example, however, operates from a lower supply voltage AVDD (e.g., 5V) than the +HV and −HV supply voltages of the HV domain. Further, the common mode of INP, INN may be higher (e.g., 14V) than the highest permitted voltage for the ADC 180 (e.g., 5V). As such, the PGA 100 adjusts the common mode of the input INP/INN to a predetermined common mode voltage, ½ AVDD, and provides adjustable gain (both attenuation and gain) to ensure the signal provided to the ADC 180 is within the proper input range for the ADC.

The input stage 151 of PGA 00 includes input amplifiers 110 and 120, a multi-tap resistor R1, and current mirrors 131, 132, 141, and 142. The output stage 161 includes amplifiers 152 and 162, resistors R2 and R3, and output capacitor C1. The voltage on the nodes on opposite sides of capacitor C1 (CAPP and CAPN) comprise the signal to be provided to the input of the ADC 180 for digitization. INP is provided to the positive (+) input of input amplifier 110, and INN is provided to the positive input of input amplifier 120. The gain within the input stage 151 is programmable. Resistor R1 comprises multiple resistors connected in series with a tap point between each series connected pair of resistors. The gain of the input stage 151 is programmable through selection of a desired tap point for connection to the negative (−) input of amplifiers 110 and 120.

Current mirror 131 comprises transistors M1 and M2. Current mirror 132 comprises transistors M3 and M4. Current mirror 141 comprises transistors M5 and M6. Current mirror 142 comprises transistors M7 and M8. In this example, transistors M1, M2, M5, and M6 are p-type metal oxide semiconductor field effect transistors (PMOS transistors), and transistors M3, M4, M7, and M8 are n-type metal oxide semiconductor field effect transistors (NMOS transistors). A transistor has a control input and a pair of current terminals. As MOS transistors, the control input is the gate, and the current terminals are the drain and source. In some implementations, one or more of the transistors M1-M8 are implemented as bipolar junction transistors (BJTs). As BJT transistors, the control input is the base, and the current terminals are the collector and emitter.

The differential output of amplifier 110 is coupled to the gates of transistors M1 and M2 as well as to the gates of transistors M3 and M4, as shown. The sources of transistors M1 and M2 are connected together and to the +HV supply rail of the HV domain. The sources of transistors M3 and M4 are connected together and to the −HV supply rail of the HV domain. The drains of M1 and M3 are connected together at node N3 and to one end terminal of resistor R1, and the drains of M2 and M4 are connected together at node N1. Node N1 is connected to the positive input of amplifier 152. The sources of transistors M5 and M6 are connected together and to the +HV supply rail. The sources of transistors M7 and M8 are connected together and to the −HV supply rail. The drains of M5 and M7 are connected together at node N4 and to the other end terminal of resistor R1 as shown, and the drains of M6 and M8 are connected together at node N2. Node N2 is connected to the positive input of amplifier 162.

The current mirror ratio of current mirrors 131, 132, 141, and 142 is 1:3, but can be a different ratio in other examples (e.g., 1:2, 1:4, etc.). The current mirrors 131, 132, 141, and 142 convert the output voltage from input amplifiers 110 and 120 into a current. With a current mirror ratio of 3, the current mirrors implement a gain factor of 3 for the current, and thus the output current from the current mirrors (through transistors M2, M4, M6, and M8) is three times the input current to the current mirrors (through transistors M1, M3, M5, and M7).

In the output stage 161, a resistor 165 is connected between node N1 and the output of amplifier 152, and a resistor 167 is connected between node N2 and the output of amplifier 162. With the current mirror ratio of the current mirrors being 1:3, the resistance of resistors 165 and 167 is ⅓ R1. That is, resistor 165 has a resistance configured to be ⅓ of the resistance selected between node N3 and the negative input of amplifier 110. Similarly, resistor 167 has a resistance configured to be ⅓ of the resistance selected between node N4 and the negative input of amplifier 120. The output of amplifier 152 is connected to resistor R2, and the output of amplifier 162 is connected to resistor R3. Amplifiers 152 and 162 convert the current from the current mirrors back to a voltage, and a signal indicative of that voltage across capacitor C1 is provided to the ADC 180. The negative inputs of amplifiers 152 and 162 are biased at ½ AVDD. For an example AVDD of 5 V, the bias voltage for the negative inputs of amplifiers 152 and 162 is 2.5V. Biasing the negative inputs of amplifiers 152 and 162 at ½ AVDD forces the common mode between nodes N1 and N2 to be ½ AVDD.

By providing a gain in the current mirrors 131, 132, 141, and 142 on the output of the input amplifiers 110 and 120, the overall noise of the output signal from the PGA 100 is reduced, compared to using, for example, current mirrors with 1:1 current mirror ratio. Gain in the current mirror (e.g., 1:3) reduces the noise especially for the attenuation mode. Because overall noise performance is input-referred, implementing the gain stage at the earlier stage (i.e., closer to the input of the amplifier) helps reduce noise. For the attenuation mode, amplifiers 110 and 120 are always set at gain of 1 so by putting gain in the current mirror, the overall noise is reduced.

Figure 2:
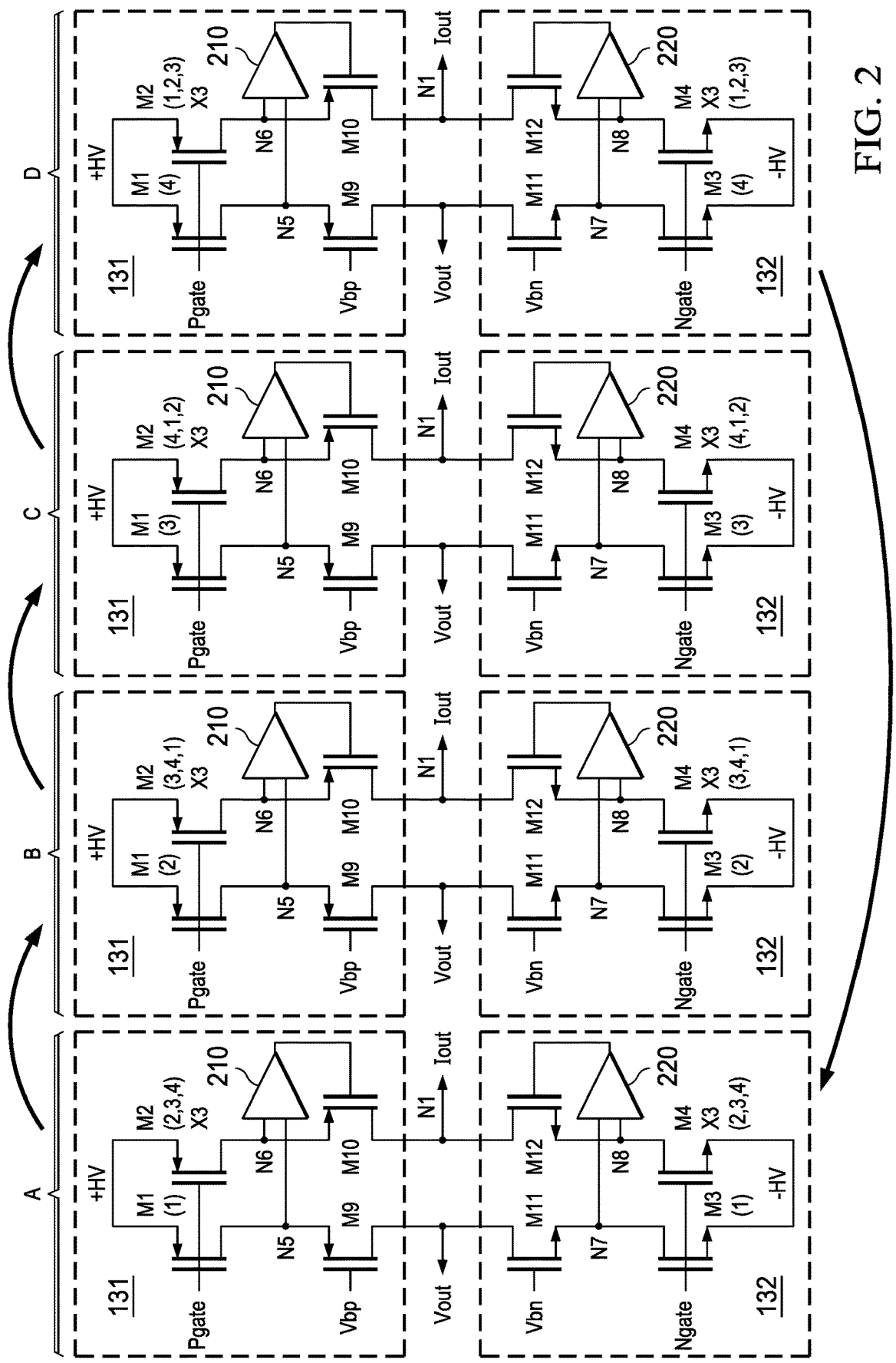
FIG. 2 illustrates chopping implemented in current mirrors within the programmable gain amplifier.

Chopping is also employed within the current mirrors to eliminate the effects of any current element mismatch (e.g., mismatch in transistor characteristics). FIG. 2 illustrates chopping within current mirrors 131 and 132. The same implementation can be employed for chopping within current mirrors 141 and 142. Four cycles A, B, C, and D are illustrated for the chopping technique implemented for the current mirrors. In this example, the chopping pattern repeats every four cycles. Current mirror 131 within each cycle A-D includes transistors M1 and M2, as well as transistors M9 and M10 and an error amplifier 210. In this example, transistors M9 and M10 are PMOS transistors. The source of transistor M9 is connected to the drain of transistor M1 at node N5, and the source of transistor M10 is connected to the drain of transistor M2 at node N6. The inputs to error amplifier 210 are connected to nodes N5 and N6. As such, error amplifier 210 amplifies the difference in the voltage been nodes N5 and N6. The gate of transistor M9 is biased at a voltage labeled Vbp, and the output of error amplifier 210 is connected to the gate of transistor M10. The output signal from the error amplifier 210 controls the gate-to-source voltage (Vgs) of transistor M2. The drain current through transistor M2 is controlled to be three-times the drain current through transistor M1 with the error amplifier controlling transistor M10 to maintain the 3× current through transistor M2.

The current mirror 132 is similarly configured. Current mirror 131 within each cycle A-D includes transistors M3 and M4, as well as transistors M11 and M12 and an error amplifier 220. In this example, transistors M11 and M12 are NMOS transistors. The source of transistor M11 is connected to the drain of transistor M3 at node N7, and the source of transistor M12 is connected to the drain of transistor M4 at node N8. The inputs to error amplifier 220 are connected to nodes N7 and N8. As such, error amplifier 220 amplifies the difference in the voltage been nodes N7 and N8. The gate of transistor M11 is biased at a voltage labeled Vbn, and the output of error amplifier 220 is connected to the gate of transistor M12. The output signal from the error amplifier 220 controls the gate-to-source voltage of transistor M4. The drain current through transistor M4 is controlled to be three-times the drain current through transistor M3 with the error amplifier 220 controlling the Vgs of transistor M12 to maintain the 3× current through transistor M4.

Figure 3:
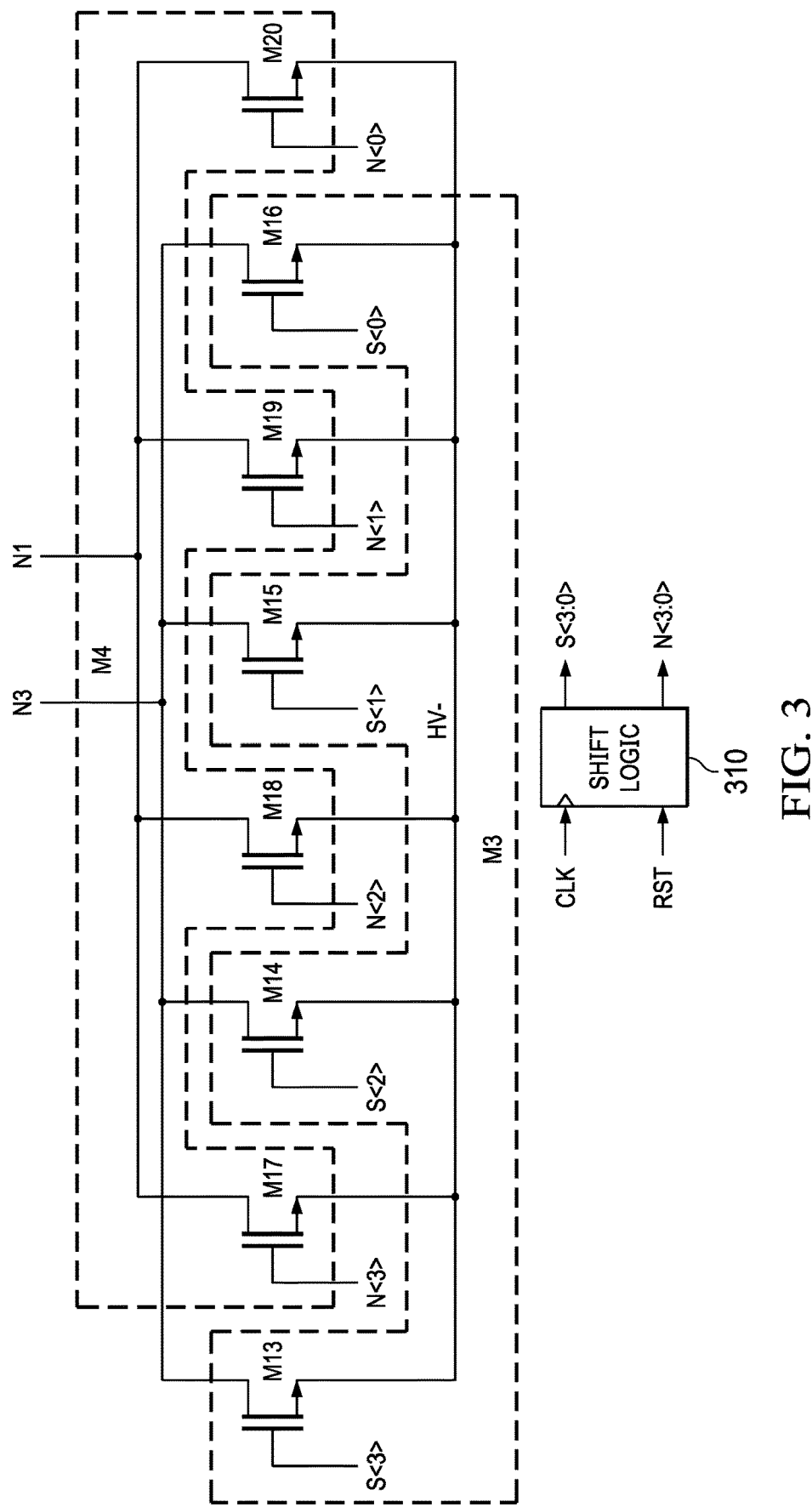
FIG. 3 shows an example implementation of the use of a shift logic circuit to control the power state of multiple transistors to implement chopping.

Referring still to FIG. 3, the numbers in parentheses adjacent transistors M1, M2, M3, and M4 illustrate the chopping technique. Transistor pair M1 and M2 is implemented from a selection and configuration of four transistors numbered 1, 2, 3, and 4. Similarly, transistor pair M3 and M4 is implemented from a selection and configuration of another four transistors numbered also numbered 1, 2, 3, and 4 for illustration purposes. Transistors 1-4 associated with transistors M1 and M2 are all of the same size, as are transistors 1-4 associated with transistor M3 and M4.

In cycle A, transistor M1 (the X1 size transistor) is implemented with transistor 1, while transistor M2 (the X3 transistor) is implemented with transistors 2-4. In cycle B, the X1 transistor M1 is implemented with transistor 2, while the X3 transistor M2 is implemented with transistors 1, 3, and 4. In cycle C, the X1 transistor M1 is implemented with transistor 3, while the X3 transistor M2 is implemented with transistors 1, 2, and 4. In cycle D, the X1 transistor M1 is implemented with transistor 4, while the X3 transistor M2 is implemented with transistors 1, 2, and 3. Thus, each of the transistors 1-4 are rotated being used to implement the smaller X1 transistor within the current mirror 131 over the course of four cycles A-D, and then the pattern repeats. The same transistor rotation pattern is implemented as well for current mirror 132.

In the example of FIG. 2, one transistor is used for the X1 transistor and three transistors are used for the X3 transistor within the current mirror. In other implementations, two transistors could be used to implement the X1 transistor and six transistors used to implement the X3 transistor and thus still maintain the 1:3 ratio for the current mirror. In general, H transistors are used for the X1 transistor (where H is an integer greater than or equal to 1) and 3H transistors are used for the X3 transistor.

FIG. 3 shows an example implementation of the current mirror 132 comprising transistors M1 and M2 employing a chopping technique. The example of FIG. 3 includes shift logic circuit 310 and transistors M13-M20. The sources of all of transistors M13-M20 are connected together. The drains of transistors M13, M14, M15 and M16 are connected together at node N3. The drains of transistors M17, M18, M19 and M20 are connected together at node N1. The gate of each transistor M13-M20 is driven with a separate signal generated by shift logic 310. Shift logic circuit 310 generates signals S<3:0> to drive the gates of transistors M13-M16 as shown, and generates signals N<3:0> to drive the gates of transistors M17-M20. As such, shift logic circuit 310 can separately control the power state of the transistors M13-M20.

Transistor M1 is implemented in each of the four cycles using a single transistor, while transistor M2 is implemented in each cycle using three transistors. Shift logic circuit 310 controls which one transistor from among M13-M16 is turned on each cycle to implement transistor M1, and which three transistors from among M17-M20 are turned on to implement transistor M2. In one example, control signals S<3:0> comprise four bits with one of the four bits in each cycle being a logic 1 and the other three bits being a logic 0. The one bit that is a logic 1 causes the corresponding transistor M13-M16 to turn on, and the other three bits that are logic 0 cause those corresponding transistors to turn off. The bit within S<3:0> that is a logic 1 rotates every time each time the clock input to shift logic circuit 310 is active (positive transitioning edges, negative transitioning edges)

Control signals N<3:0> also comprise four bits, and three of the four bits are logic 1 in each cycle and one bit is a logic 0. The three transistors M17-M20 whose gates receive a logic 1 from shift control 310 turn on, while remaining transistor is off. The shift logic circuit 310 rotates which of the four transistors M17-M20 are turned on. In one example, N<3:0> is the logic inverse of S<3:0>.

In one example, the rotating pattern of S<3:0> and N<3:0> four cycles of the shift control circuit 310 is provided below in Table I, along with the identification of those transistors that are on and those that are off in each of the corresponding cycles.

TABLE I

| S <3:0> | N <3:0> | M13 | M14 | M15 | M16 | M17 | M18 | M19 | M20 |
|---|---|---|---|---|---|---|---|---|---|
| 1000 | 0111 | on | off | off | off | off | on | on | on |
| 0100 | 1011 | off | on | off | off | on | off | on | on |
| 0010 | 1101 | off | off | on | off | on | on | off | on |
| 0001 | 1110 | off | off | off | on | on | on | on | off |

The configuration of the transistor pairs M1/M2, M5/M6, and M7/M8 is implemented in the same manner as shown in FIG. 3 for transistors M3 and M4 (although transistor pairs M1/M2 and M5/M6 comprise PMOS transistors).

Figure 4:
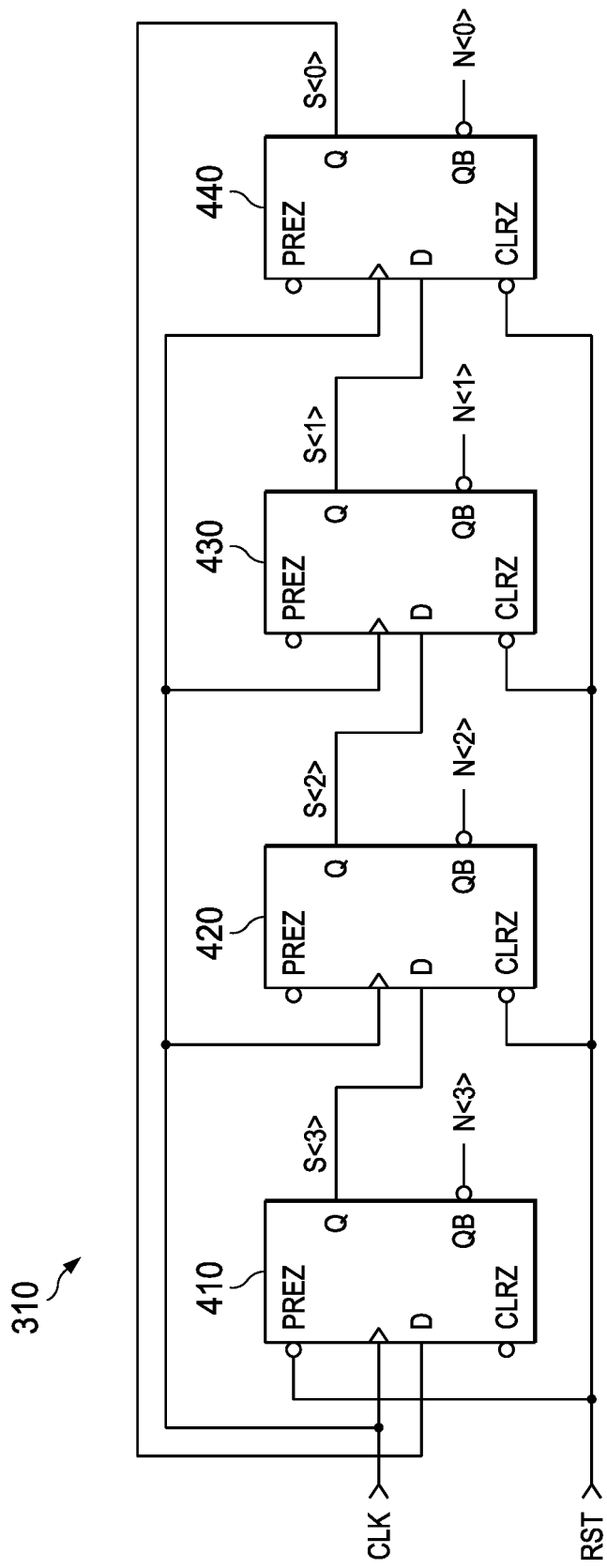
FIG. 4 shows an example implementation of the shift logic circuit of FIG. 3.

FIG. 4 shows an example implementation of shift logic circuit 310. In this example, shift logic circuit 310 comprises four D flip-flops 410, 420, 430, and 440. Each D flip-flop 410-440 comprises a data (D) input, a clock input, a preset input (PREZ), and clear input (CLRZ). The PREZ and CLRZ inputs are active low. A logic low signal on the PREZ input causes the Q output of the flip-flop to be asserted to a logic 1 (and thus the Q bar output, QB, will be a logic 0). A logic low signal on the CLRZ input causes the Q output of the flip-flop to be a logic 0 (and thus the QB output will be a logic 1).

The reset signal (RST) is an active low signal to initialize the shift logic circuit 310. RST is provided to the PREZ input of D flip-flop 410 and to the CLRZ inputs of each of D flip-flops 420-440. Thus, when RST is low, the Q output of D flip-flop 410 is asserted high and the QB outputs of the D flip-flops 420, 430, and 440 are forced low. The S<3>, S<2>, S<1>, and S<0> control signals are the Q outputs of D flip-flops 410, 420, 430, and 440, respectively. The N<3>, N<2>, N<1>, and SN<0> control signals are the QB outputs of D flip-flops 410, 420, 430, and 440, respectively. Thus, when RST is asserted low, S<3:0> becomes <1000>, and N<3:0> becomes <0111>.

The Q output of D flip-flop 410 is coupled to the D input of D flip-flop 420. The Q output of D flip-flop 420 is coupled to the D input of D flip-flop 430, and the Q output of D flip-flop 430 is coupled to the D input of D flip-flop 440. The Q output of D flip-flop 440 is provided to the D input of D flip-flop 410.

After RST asserts low to initialize the S<3:0> and N<3:0> control signals, RST is forced high to release the reset state of the D flip-flops 410-440. At that point, the state of the D flip-flops is controlled by the clock. With each assertion of the clock, the Q output of each D flop-flop is asserted to the logic level of its D input, which is the logic level of the preceding D flip-flop's Q output. As such, the D flip-flops in the example of FIG. 4 implement the shift functionality described above in Table I.

Figure 5:
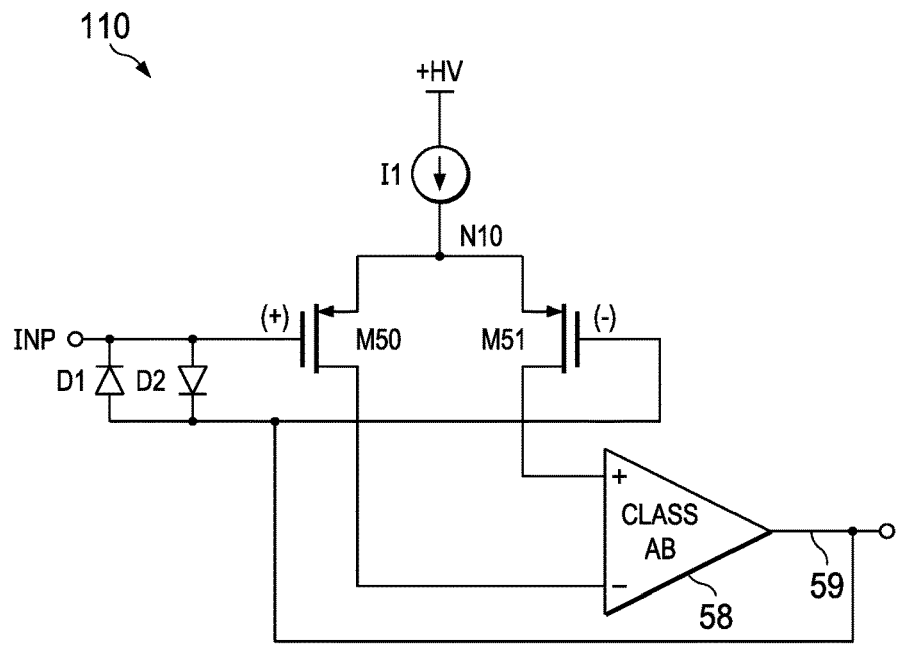
FIG. 5 shows an example of an amplifier usable within the programmable gain amplifier of FIG. 1.
Figure 6:
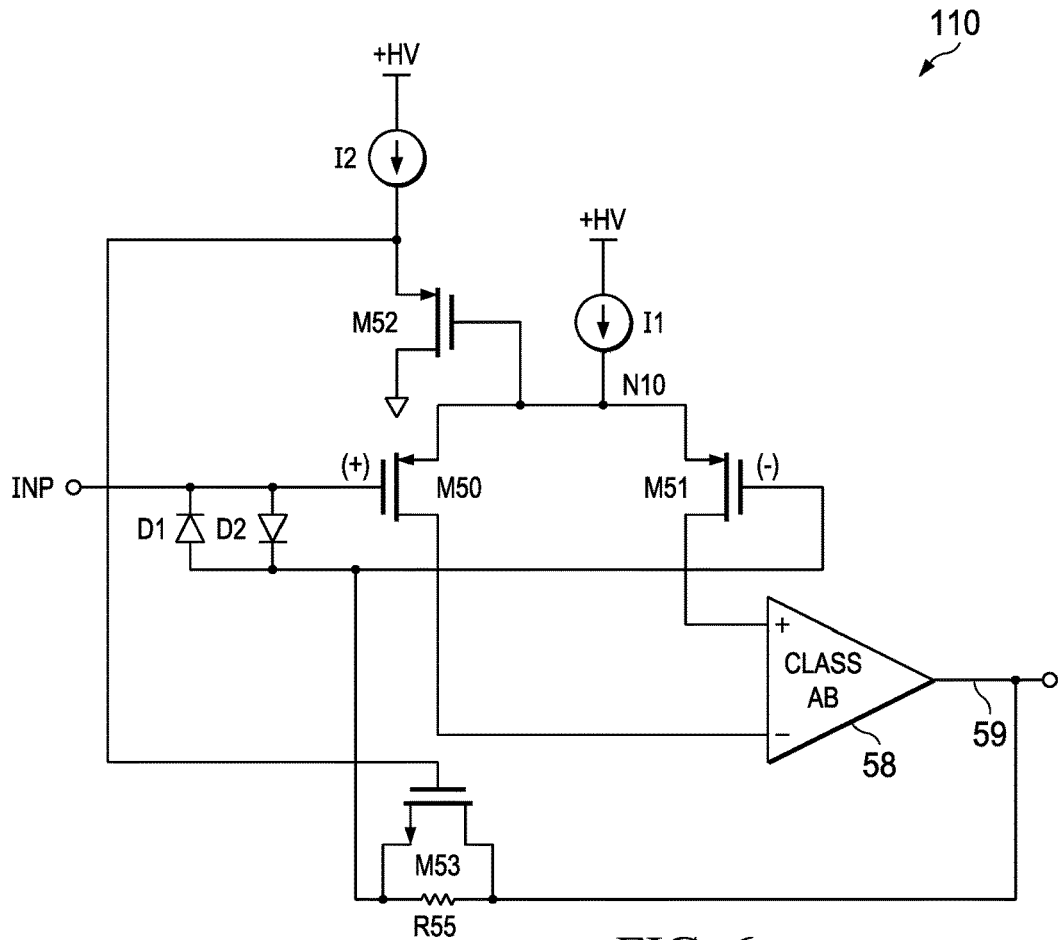
FIG. 6 shows another example of an amplifier usable within the programmable gain amplifier of FIG. 1.

FIG. 5 shows an example implementation of amplifier 110 of FIG. 1. The same or similar implementation can be used for amplifier 120 as well. The amplifier 110 of FIG. 5 includes a current source I1, an input transistor pair M50 and M5, an output stage 58, and diodes D1 and D2. Transistors M50 and M51 comprise PMOS transistors in this example. The sources of M50 and M51 are connected together at node N10 and to the current source I1. Current source I1 is connected to +HV and causes current to flow into either or both of the transistors M50 and M51. The drains of M50 and M51 are connected to the output stage 58, which may be a class AB output stage. The output 59 of the output stage 58 provides the output signal from the amplifier 110. The output stage 58 in FIG. 6 represents the amplifier 110 and current mirror 131 of FIG. 1. Output 59 is node N3 in FIG. 1.

The gate of M50 is the positive (+) input of amplifier 110, and the gate of M51 is the negative (−) input of amplifier 110. The input signal INP is provided to the gate of transistor M50. The output 59 from the output stage 58 is provided to the gate of transistor M51. Diodes D1 and D2 are connected between the positive and negative inputs of the amplifier 110, and are protection diodes. The protection diodes D1 and D2 act as voltage clamps to protect the input transistor pair M50 and M51, which may be implemented as low voltage devices. The amplifier 110 is configured to have unity gain (gain equals 1), which means that the output voltage on output 59 tracks and is equal to the input voltage on the gate of M50. However, if the input voltage of INP rises very rapidly (e.g., a step change) and up to its upper permitted limit e.g., +HV less the voltage drop across current source I1 and the Vgs of M50), the output voltage may overshoot and be approximately +HV). As the INP signal begins to decrease, protection diode D1 turns on because the output voltage on its anode is more than the on-voltage of the diode (about 0.7V). When this happens, the voltage on the gate of transistor M50 may become stuck at the output voltage (approximately +HV) minus the voltage drop across diode D1 (approximately 0.7V). The feedback from the output stage 58 and diode D1 prevents the voltage on the gate of transistor M50 from being less than +HV minus the diode voltage drop despite an external circuit attempting to actively pull INP to a lower voltage. With the gates of both of transistors M50 and M51 being approximately +HV, neither transistor M50 nor transistor M51 will be on, and the output of the amplifier will not be able to track the input with unity gain—the amplifier will be non-functional.

FIG. 6 addresses the aforementioned problem of the amplifier input becoming stuck when the input rises rapidly to its upper limit. In addition to the same components shown in FIG. 6, the amplifier 110 of FIG. 6 also includes resistor R55, current source I2, and transistors M52 and M53. In this example, transistor M52 is a PMOS transistor and transistor M53 is an NMOS transistor. Current source I2 is connected between +HV and the source of transistor M52. The drain of transistor M52 is connected to ground. When M52 is on, I2 current flows through transistor M52 to ground. The gate of transistor M52 is connected to node N10. The source of transistor M52 is connected to the gate of transistor M53. Transistor M53's source and drain are connected to the opposing terminals of resistor R55.

During normal operation when the output voltage on output 59 tracks and equals the INP input voltage, transistors M50 and M51 are on and the voltage on node N10 will be one Vgs above the input voltage on INP. Transistor M52 also will be on and the voltage on its source will be one Vgs above the voltage node N10, and thus two Vgs's above INP. The gate of transistor M53 will thus be 2 Vgs's above the input voltage. The source of transistor M53 is connected to the output 59 of the output stage 58. The output 59, during normal operation, equals the input voltage, and thus the source of transistor M53 will be approximately equal to the input voltage (INP). As such, the Vgs of transistor M53 will be approximately 2 V and thus above its threshold voltage. As such, transistor M53 will be on during normal operation, thereby shorting resistor R55 and configuring the amplifier for unity gain.

During the anomalous condition in which the input and output voltages become stuck at voltages close to +HV, transistors M50, M51, and M52 will be off. When this happens, no drain current flows through transistors M50, M51, or M52. The voltage on the source of transistor M52 will be approximately +HV, and thus the voltage on the gate of transistor M53 also be approximately +HV. With no drain current flowing through transistor M51, the voltage on its gate will also be approximately +HV, and thus the voltage on the source of transistor M53 will be approximately +HV. As such, the Vgs for transistor M53 will be too low maintain transistor M53 on, and thus transistor M53 turns off, thereby electrically coupling resistor R55 between the output 59 and the gate of transistor M51. Resistor R55 limits the current from the output 59 to the gate of transistor M51 and thus causes the voltage on the gate of transistor M51 to decrease, thereby returning the amplifier to its normal operation.

In this description, the term "couple" or "couples" means either an indirect or direct wired or wireless connection. Thus, if a first device couples to a second device, that connection may be through a direct connection or through an indirect connection via other devices and connections. Modifications are possible in the described embodiments, and other embodiments are possible, within the scope of the claims.

What is claimed is:

1. A circuit, comprising:
   a first transistor having a first control input, a first current terminal, and a second current terminal;
   a second transistor having a second control input, a third current terminal, and a fourth current terminal, the third current terminal coupled to the first current terminal;
   an output stage having a first input, a second input, and an output stage output, the first input coupled to the fourth current terminal, and the second input coupled to the second current terminal;
   a resistor having first and second resistor terminals, the first resistor terminal coupled to the output stage output, and the second resistor terminal coupled to the second control input; and
   a third transistor having a third control input, a fifth current terminal, and a sixth current terminal, the fifth current terminal coupled to the first resistor terminal, and the sixth current terminal coupled to the second resistor terminal.

2. The circuit of claim 1, further comprising a fourth transistor having a fourth control input, a seventh current terminal, and an eighth current terminal, the fourth control input coupled to the first current terminal, and the seventh current terminal coupled to the third control input.

3. The circuit of claim 2, further comprising:
   a first current source device coupled to the first current terminal, and
   a second current source device coupled go the seventh current terminal.

4. The circuit of claim 3, wherein:
   during a first mode of operation, a voltage on the second control input is configured to track a voltage on the first control input, and the third and fourth transistors are configured to be on; and
   during a second mode operation, the voltages on the first and second control inputs become stuck at a first voltage, and the third and fourth transistors are configured to be off, thereby causing current to flow through the resistor and transition the circuit to the first mode of operation.

5. The circuit of claim 1, further comprising a first diode coupled between the first control input and the second control input, and comprising a second diode coupled between the first control input and the second control input.

6. The circuit of claim 1, wherein:
   during a first mode of operation, a voltage on the second control input is configured to track a voltage on the first control input, and the third transistor is configured to be on; and
   during a second mode operation, the voltages on the first and second control inputs become stuck at a first voltage, and the third transistor is configured to be off, thereby causing current to flow through the resistor and transition the circuit to the first mode of operation.

7. A circuit, comprising:
   a first amplifier having an input and an output;
   a current-to-voltage amplifier having an input; and
   a first current mirror coupled between the output of the first amplifier and the input of the current-to-voltage amplifier;
   the first amplifier including:
      a first transistor having a first control input, a first current terminal, and a second current terminal;
      a second transistor having a second control input, a third current terminal, and a fourth current terminal, the third current terminal coupled to the first current terminal;
      an output stage having a first input, a second input, and an output stage output, the first input coupled to the fourth current terminal, and the second input coupled to the second current terminal;
a resistor having first and second resistor terminals, the first resistor terminal coupled to the output stage output, and the second resistor terminal coupled to the second control input; and
a third transistor having a third control input, a fifth current terminal, and a sixth current terminal, the fifth current terminal coupled to the first resistor terminal, and the sixth current terminal coupled to the second resistor terminal.

8. The circuit of claim 7, further comprising a fourth transistor having a fourth control input, a seventh current terminal, and an eighth current terminal, the fourth control input coupled to the first current terminal, and the seventh current terminal coupled to the third control input.

9. The circuit of claim 8, further comprising:
a first current source device coupled to the first current terminal, and
a second current source device coupled go the seventh current terminal.

10. The circuit of claim 9, wherein:
during a first mode of operation, a voltage on the second control input is configured to track a voltage on the first control input, and the third and fourth transistors are configured to be on; and
during a second mode operation, the voltages on the first and second control inputs become stuck at a first voltage, and the third and fourth transistors are configured to be off, thereby causing current to flow through the resistor and transition the circuit to the first mode of operation.

11. The circuit of claim 7, further comprising a first diode coupled between the first control input and the second control input, and comprising a second diode coupled between the first control input and the second control input.

12. The circuit of claim 7, wherein:
during a first mode of operation, a voltage on the second control input is configured to track a voltage on the first control input, and the third transistor is configured to be on; and
during a second mode operation, the voltages on the first and second control inputs become stuck at a first voltage, and the third transistor is configured to be off, thereby causing current to flow through the resistor and transition the circuit to the first mode of operation.

13. A circuit, comprising:
a first transistor having a first control input, a first current terminal, and a second current terminal;
a second transistor having a second control input, a third current terminal, and a fourth current terminal, the third current terminal coupled to the first current terminal;
an output stage having a first input, a second input, and an output stage output, the first input coupled to the fourth current terminal, and the second input coupled to the second current terminal;
a third transistor coupled to the output stage output and to the fourth current terminal; and
a resistor coupled to the output stage output and to the second control input;
responsive to a voltage on the second control input tracking a voltage on the first control input, the third transistor is configured to be on to cause current to flow through from the output stage output through the third transistor and to the second control input; and
responsive to the voltages on the first and second control inputs become stuck at a first voltage, the third transistor is configured to be off, thereby causing current to flow from the output stage output through a resistor to the second control input.

14. The circuit of claim 13, further comprising a fourth transistor having a fourth control input, a seventh current terminal, and an eighth current terminal, the fourth control input coupled to the first current terminal, and the seventh current terminal coupled to the third control input.

15. The circuit of claim 14, further comprising:
a first current source device coupled to the first current terminal, and
a second current source device coupled go the seventh current terminal.

16. The circuit of claim 14, wherein the first, second, and fourth transistors comprise p-type metal oxide semiconductor field effect transistors, and the third transistor comprises an n-type metal oxide semiconductor field effect transistor.

17. The circuit of claim 13, further comprising a first diode coupled between the first control input and the second control input, and comprising a second diode coupled between the first control input and the second control input.

18. The circuit of claim 13, wherein responsive to the voltage on the second control input tracking a voltage on the first control input, both the third and fourth transistors are configured to be on.

19. The circuit of claim 13, wherein responsive to the voltages on the first and second control inputs becoming stuck at the first voltage, both the third and fourth transistors are configured to be off.

20. The circuit of claim 13, wherein the output stage is a class AB output stage.

* * * * *